United States Patent [19]

Ishida

[11] Patent Number: 4,518,919
[45] Date of Patent: May 21, 1985

[54] DETECTING DEVICE FOR DETECTING A MAGNETIC STRIP EMBEDDED IN A SHEET

[75] Inventor: Tsuyoshi Ishida, Yokohama, Japan

[73] Assignee: Tokyo Shibaura Denki Kabushiki Kaisha, Kawasaki, Japan

[21] Appl. No.: 336,684

[22] Filed: Jan. 4, 1982

[30] Foreign Application Priority Data

Jan. 16, 1981 [JP] Japan .................................. 56-3893
Jun. 3, 1981 [JP] Japan ................................ 56-84314
Jun. 29, 1981 [JP] Japan ................................ 56-99619

[51] Int. Cl.³ ..................... G01R 33/12; G01N 27/72; G07D 7/00; G06K 7/08
[52] U.S. Cl. ............................... 324/228; 194/100 A; 235/449; 324/235
[58] Field of Search ............... 324/207, 208, 228, 235, 324/236, 239, 251, 252, 200, 173; 235/449, 493; 194/100 R, 100 A; 340/675, 676

[56] References Cited

U.S. PATENT DOCUMENTS

| | | | |
|---|---|---|---|
| 2,228,294 | 1/1941 | Wurzbach | 324/339 |
| 2,513,745 | 7/1950 | Reynolds | 324/239 |
| 3,195,043 | 7/1965 | Burig et al. | 324/251 X |
| 3,493,694 | 2/1970 | Hunt | 324/252 X |
| 3,896,292 | 7/1975 | May | |
| 4,066,962 | 1/1978 | Jaffe | 324/235 X |
| 4,096,437 | 6/1978 | Kitzinger | 324/235 X |
| 4,107,601 | 8/1978 | Barmeier et al. | 324/200 |
| 4,229,696 | 10/1980 | Gustafson | 324/228 X |
| 4,255,708 | 3/1981 | Wilson | 324/208 |

FOREIGN PATENT DOCUMENTS

| | | | |
|---|---|---|---|
| 8998 | 3/1980 | European Pat. Off. | |
| 21350 | 1/1981 | European Pat. Off. | |
| 2020834 | 11/1970 | Fed. Rep. of Germany | 324/252 |
| 2619457 | 11/1977 | Fed. Rep. of Germany | |
| 2830314 | 1/1980 | Fed. Rep. of Germany | |
| 2834287 | 2/1980 | Fed. Rep. of Germany | |
| 69673 | 6/1977 | Japan | 324/235 |
| 97115 | 8/1979 | Japan | 324/235 |
| 54-136900 | 10/1979 | Japan | |
| 1293821 | 10/1972 | United Kingdom | 324/231 |
| 2012966 | 8/1979 | United Kingdom | 324/235 |
| 2017996 | 10/1979 | United Kingdom | 324/236 |

*Primary Examiner*—Gerard R. Strecker
*Attorney, Agent, or Firm*—Banner, Birch, McKie & Beckett

[57] ABSTRACT

A paper note containing a magnetic strip is transported along a path and adjacent a magnetic detector. This magnetic detector comprises a magnet and a magnetic resistance element provided in the magnetic field generated by the magnet. When the magnetic strip passes through this magnetic field, the change in the field is detected by circuitry. This circuitry detects the change in resistance of the magnetic resistance element. By checking the change in resistance of the resistance element and comparing it with a predetermined value, the existance or non-existance of the magnetic strip can be determined.

3 Claims, 19 Drawing Figures

FIG. 4
(a) SIGNAL B
(b) SIGNAL C
(c) SIGNAL D

DETECTING DEVICE FOR DETECTING A MAGNETIC STRIP EMBEDDED IN A SHEET

BACKGROUND OF THE INVENTION

This invention relates to a detecting device for detecting a magnetic strip embedded in a sheet such as a check or other currency note.

Because of the excellent quality of copies produced by modern copying or printing machines, counterfeit notes, which are difficult to detect, have been easily made using these machines. Countermeasures against such counterfiets have been devised in many countries by embedding a metal strip in the note. A detecting device for automatically discriminating between genuine and counterfeit notes has been developed which detects the existence of the metal strip by utilizing eddy-current loss, as shown in the United Kingdom Patent Application No. 2017996. The eddy current loss is represented as $PC = K(dB/dt)$, ($B$ = magnetic flux density, $K$ = electrical conductivity = 1/electrical resistance). The electrical resistance value of non-magnetic metals is generally low (e.g., Al is 2.65 $\mu\Omega cm$; Cu is 1.7 $\mu\Omega cm$). Since the conductivity ($K$) between magnetic metals and non-magnetic metals greatly varies, the sensitivity to non-magnetic metals (e.g., aluminum) is high due to its high eddy current loss ($Pc$); the sensitivity to magnetic metals (e.g., iron), however, is very low due to the low eddy current loss ($Pc$). Therefore, the use of these prior art systems in detecting a magnetic metal strip has resulted in mis-detection or non-detection of the metal strip.

In order to detect magnetic strips embedded in paper notes, conventional inductive proximity detectors (see, e.g. U.K. Pat. No. 2,017,996) have been considered as an appropriate solution. Such detectors, however, are not capable of detecting a magnetic strip which is traveling rapidly in front of the detecting head, due to the very small diameter of the strip. As a result, the signal obtained has an insufficient level and may also contain noise signals.

BRIEF SUMMARY OF THE INVENTION

This invention overcomes the prior art disadvantages mentioned above. This invention provides a detecting device for accurately detecting a magnetic strip embedded in a sheet. This device is useful for discriminating whether a note is genuine or counterfeit.

Another object of the invention is to provide a detecting apparatus which more securely detects the existence of a magnetic strip in the note. According to the present invention, a magnetic detector is positioned adjacent to the transportation path of the note. This magnetic detector comprises a magnet and a magnetic resistance element positioned in the magnetic flux path of the magnet. When a magnetic strip embedded in the transported note, passes through this magnetic flux path, a change in the magnetic field along the magnetic flux path is produced. This change in the magnetic field is detected since it results in a change in resistance of the magnetic resistance element. Detection is performed by comparing the change in resistance with a predetermined value.

The apparatus of the present invention securely detects the presence of a magnetic strip in the paper note without interference with the movement of the note. As the paper note is transported through the magnetic flux path, it is not interfered with by the detector; consequently, the paper note is not folded or jammed by the detector. Furthermore, the apparatus of the instant invention can measure the length of the magnetic strip; as a result, the apparatus is capable of securely discriminating a counterfeit from a genuine note even though it has been folded or partly broken. Other objects and features of the present invention will be apparent from the following description read in connection with the accompanying drawings.

BRIEF DESCRIPTION OF THE DRAWING

FIG. 1b is a vertical sectional view of the note shown in FIG. 1a;

FIG. 2b is a side view of the detecting head shown in FIG. 2a;

FIGS. 4(a), (b) and (c) are signal waveform diagrams of each element shown in FIG. 3;

FIG. 5b is a side view of the detecting device shown in FIG. 5a;

FIG. 6b is a side view of the detecting device shown in FIG. 6a;

FIG. 8b is a side view of the detecting device shown in FIG. 8a;

FIG. 11b is a side view of the detecting device shown in FIG. 11a; and

DETAILED DESCRIPTION OF THE PREFERRED EMBODIMENT

Figure 1A:
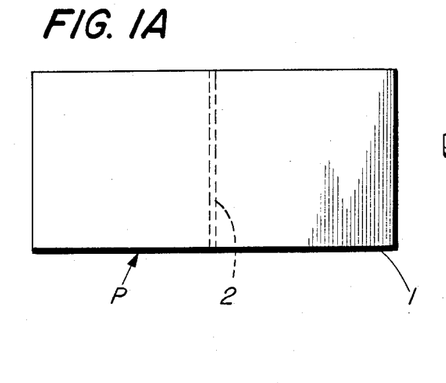
FIG. 1a is a plan view of a paper note used with the detecting device of the present invention.
Figure 1B:
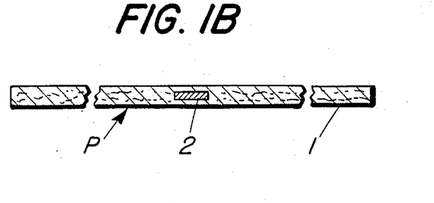

As shown in FIGS. 1(a) and (b), a paper note P includes an elongated magnetic strip 2 embedded with its sheet 1. This magnetic strip 2 is made of a material such as iron, approximately 20 $\mu m$ in thickness and approximately 0.5 to 1.0 mm in width. Its length is the same size as the width of paper 1. Magnetic strip 2 is positioned in note P such that the longitudinal axis of strip 2 extends along the width of the note and in a direction perpendicular to the transportation path of paper 1.

Figure 2A:
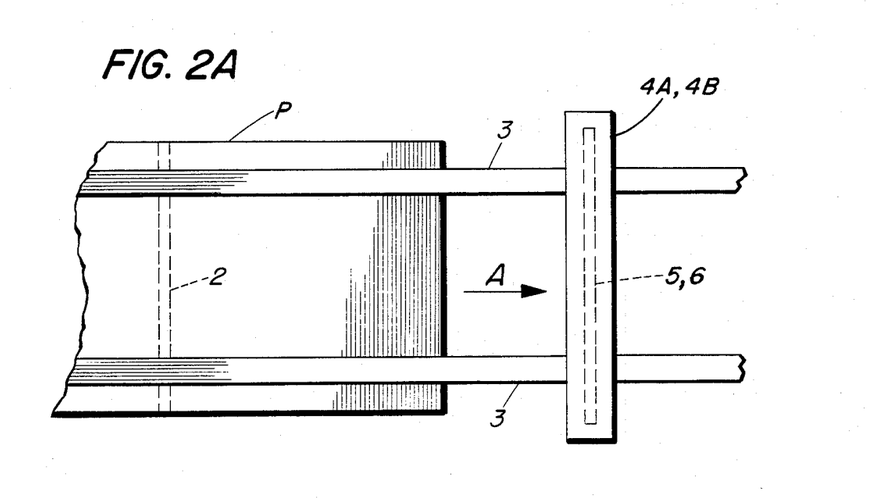
FIG. 2a is a plan view showing a detecting head according to the present invention.
Figure 2B:
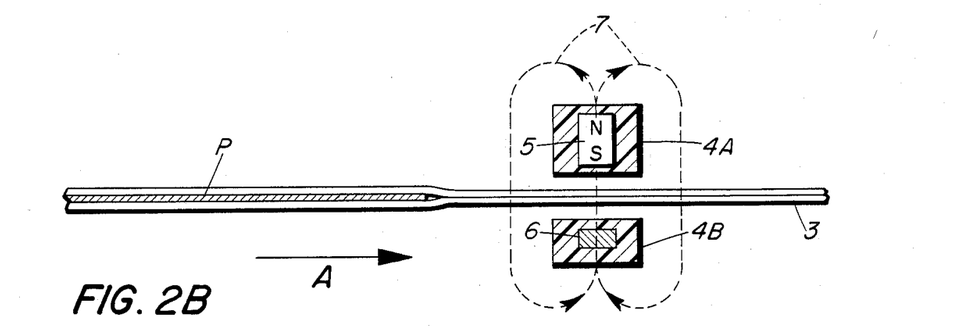

As shown in FIGS. 2(a) and (b), note P is transported in a direction indicated by arrow A by two spaced transporting belts 3, through detecting heads 4A, 4B. Each belt consists of an upper and lower contacting belt which move in direction A. Note P is snugly held at each side between transporting belt 3. Positioned above and below belts 3 are a pair of elongated detecting heads 4A and 4B. Detecting heads 4A and 4B are aligned and have their alignment axis positioned in a direction perpendicular to transporting direction A. Detecting head 4A, positioned above belt 3, comprises a non-magnetic rectangular body (e.g., vinyl chloride) and an elongated permanent magnet 5 embedded in the non-magnetic body. Permanent magnet 5 has its N-S axis oriented so that it passes through the path A of note P. Detecting head 4B, positioned below belt 3, comprises a non-magnetic elongated body (e.g., vinyl chloride) and a narrow magnetic resistance element 6 embedded in the rectangular body. Permanent magnet 5 is made of ferrite and has a magnetic flux density of about 2K gauss. Magnetic resistance element 6 is made of a semiconductor composition InSb, and has a resistance value of approximately 200Ω. As shown, the longitudinal axis of permanent magnet 5 and magnetic resistance element 6 are positioned in a direction perpendicular to the transporting direction A of note P.

Paper note P is then transported by belts 3 between, and without contact with, detecting heads 4A and 4B. As shown, permanent magnet 5 and resistance element 6 have an equal length which is greater than the length of magnetic strip 2. However, the widths of permanent magnet 5, element 6 and magnet strip 2 are equal. As shown in FIG. 2(b), permanent magnet 5 has its N-S polarity oriented so that its magnetic field 7 cuts transporting path A and the surface of paper note P as it is transported between detecting heads 4A and 4B.

Figure 3:
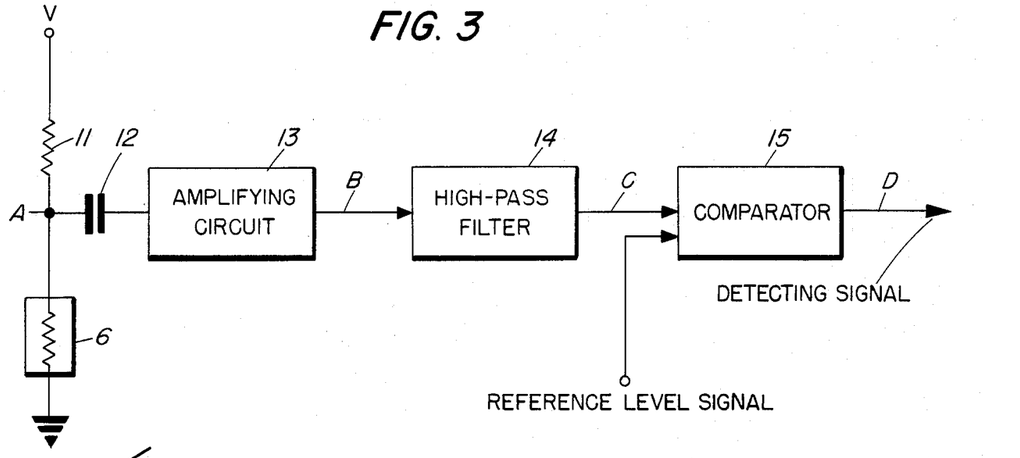
FIG. 3 is a block diagram of the electrical circuitry of the detecting device shown in FIGS. 2a and b.

In FIG. 3, one end of magnetic resistance element 6 is grounded, while its other end is connected via a resistance 11, to a DC power supply V. At the connecting point A of resistance element 6 and resistance 11, a voltage signal is obtained which varies according to the variation in resistance of resistance element 6. Point A is connected, via a capacitor 12, to the input terminal of an amplifying circuit 13. The output of amplifying circuit 13 is supplied to a high-pass filter 14. High-pass filter 14 comprises, for example, a T-shaped circuit having a capacitor and a resistor; this filter passes only high frequency signals over 5K Hertz from amplifying circuit 13. The output of filter 14 is then supplied to a comparator 15. Comparator 15, by comparing the output signal of filter 14 with a fixed reference level signal, converts the output signal of filter 14 into a binary signal.

Figure 4:
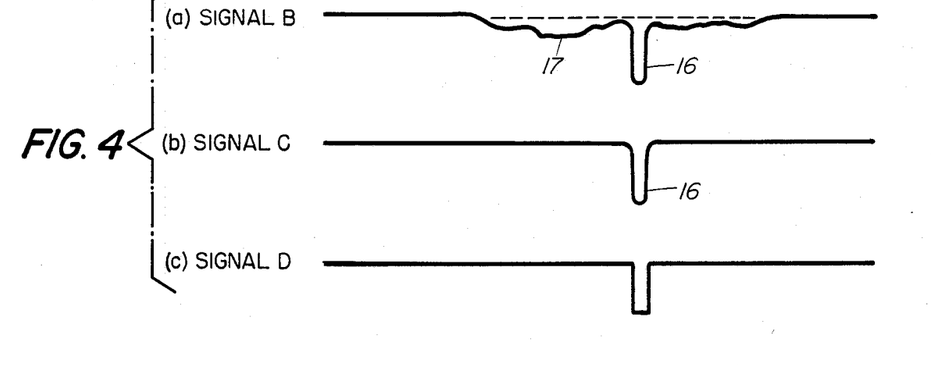

The detecting device operates as follows. When paper note P does not pass between detecting heads 4A, 4B, magnetic resistance element 6 has a resistance of 20Ω caused by the uninterrupted magnetic field 7 of permanent magnet 5. If, however, paper note P in which magnetic strip 2 is embedded is transported between detecting heads 4A, 4B, magnetic field 7 will be attenuated causing the resistance of magnetic resistance element 6 to decrease. Therefore, a temporary voltage variation will be produced at connection point A as strip 2 passes between the detecting heads. This voltage signal is then amplified by amplifying circuit 13, resulting in a signal B, as shown in FIG. 4(a). Portion 16 of signal B represents the passage of the magnetic strip 2. Portion 17, a smaller amplitude change than portion 16, represents the presence of magnetic ink contained in a printed pattern on the paper note. Signal B, after filtering out the lower frequency components by high-pass filter 14, results in signal C, as shown in FIG. 4(b). As shown, signal C includes only the signal produced by metal strip P. Signal C is then supplied to comparator 15 wherein it is compared with a reference level signal and converted into a binary signal, as shown in FIG. 4(c). This binary signal is then transmitted to a paper note discriminating device (not shown) for discriminating whether the note is genuine or counterfeit.

Figure 5A:
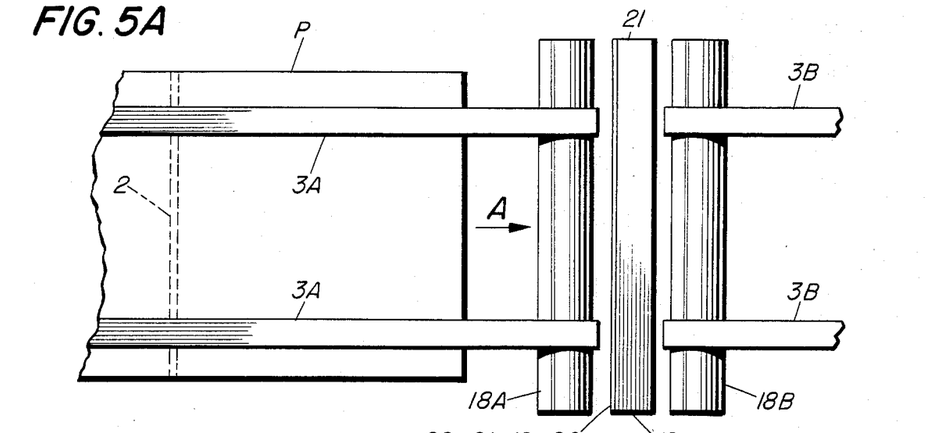
FIG. 5a is a plan view of another embodiment of a detecting device according to the present invention.
Figure 5B:
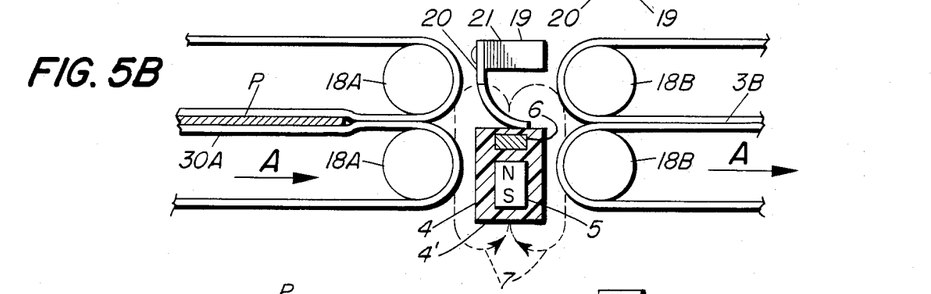

Another embodiment according to the present invention is shown in FIGS. 5(a) and (b). In this embodiment, paper note P is transported by belts 3A, 3A in direction A and then delivered, at a position between rollers 18A, 18B, to transporting belts 3B, 3B to continue its movement. Positioned between rollers 18A and 18B, is a single detecting head 4 comprising permanent magnet 5 and magnetic resistance element 6. In this single detecting head, magnetic resistance element 6 is located above, and aligned with, permanent magnet 5 in housing 4' of non-magnetic material, e.g., vinyl chloride. As with the detecting head of FIGS. 2(a) and (b), permanent magnet 5 has its N-S axis oriented so that it passes through the path A of note P. The path of note P is designed so that the note passes just above the upper surface of housing 4'. Spaced above detecting head 4 is a depressing mechanism 19 which depresses paper note P onto the upper surface of housing 4'. Depressing mechanism 19 consists of an elastic depressing arm 20 made of phosphor bronze and a stationary supporting member 21 which secures one end of elastic arm 20. In this embodiment, paper note P is made to contact detecting head 4 by the depressing action of arm 20; as a result, inaccuracies in detection are precluded since the distance between the note and the resistance element is now constant. Variation in distance between the note and resistance element produces variations in the resistance of element 6 and erroneous results.

Figure 6A:
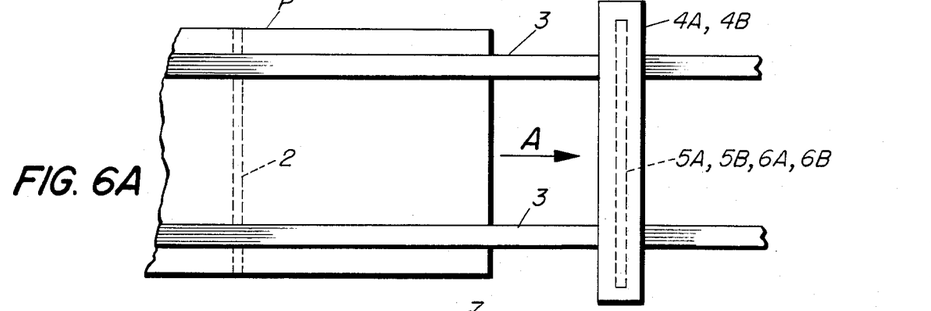
FIG. 6a is a plan view of still another embodiment of a detecting device according to the present invention.
Figure 6B:
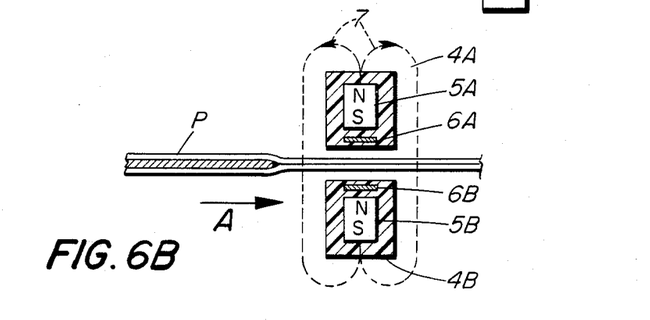

In still another embodiment of the invention shown in FIGS. 6(a) and (b), each non-magnetic detecting head 4A (4B) comprises a respective permanent magnet 5A (5B) and an aligned magnetic resistance element 6A (6B). Paper note P is transported between, and without contact with, spaced detecting heads 4A and 4B. Permanent magnets 5A, 5B have their N-S axis oriented so that it passes through the path A of note P. Consequently, their N-S polarity is oriented so that their magnetic fields 7 cut the transporting path A and surface of paper note P.

Figure 7:
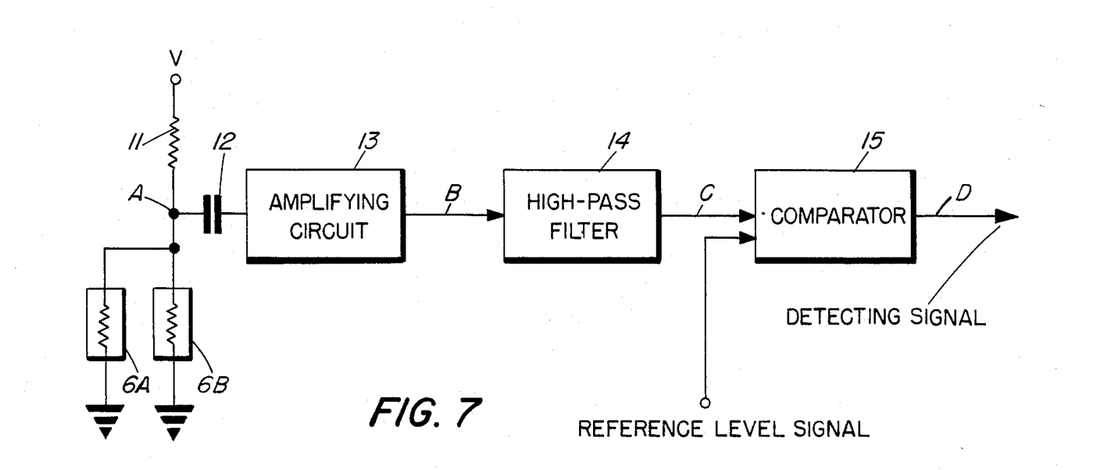
FIG. 7 is a block diagram of the electrical circuitry of the detecting device shown in FIGS. 6a and b.

FIG. 7 shows an electrical circuit for the detecting device shown in FIG. 6. One end of each magnetic resistance element 6A, 6B is grounded, while its other end is connected together at point A, via a resistance 11, to a power supply. At the connecting point A, a voltage signal is obtained which varies corresponding to the variation in resistance of magnetic resistance elements 6A, 6B. The output signal from point A is supplied to circuit elements which function in the same manner as previously described.

Figure 8A:
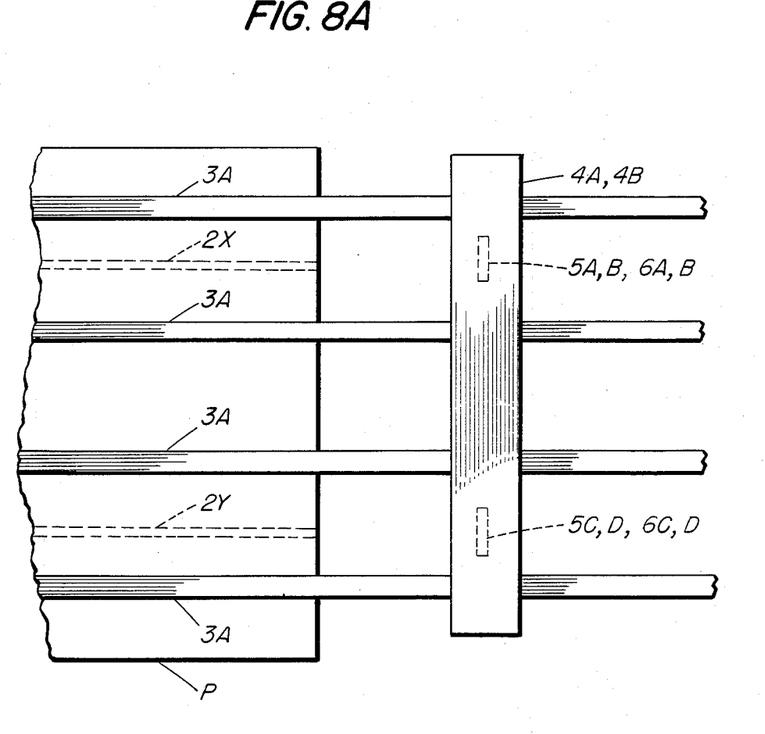
FIG. 8a is a plan view of a still further embodiment of a detecting device according to the present invention.
Figure 8B:
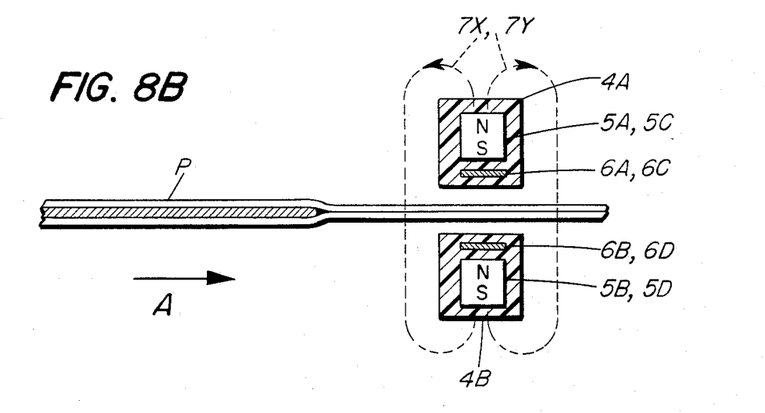

In still another embodiment of the invention shown in FIGS. 8(a) and (b), paper note P, having a magnetic strip, is oriented on belts 3A with its longitudinal axis perpendicular to the direction of travel A. Magnetic strip 2X is, therefore, positioned in a direction parallel to transporting direction A. As shown, magnetic strip 2X is embedded in an off-center position in note P. Further, designation 2Y shows the position of the magnetic strip if paper note P is transported upside down on belts 3A. Detecting heads 4A, 4B are aligned and positioned above and below belts 3A. End detecting head has a set of spaced permanent magnets and a set of spaced resistance elements embedded in a non-magnetic housing (e.g., vinyl chloride). Each set of spaced permanent magnets 5A, 5C (5B, 5D) and set of spaced magnetic resistance elements 6A, 6C (6B, 6D) are embedded in a respective detecting head 4A (4B). As shown, the N-S axis of permanent magnets 5C, 5D are aligned with magnetic resistance elements 6C, 6D. Detecting elements 5A, 5B, 6A, 6B are utilized to detect the strip if it is in position 2X, while detecting elements 5C, 5D, 6C, 6D are utilized to detect the strip in position 2Y. The length of each permanent magnet 5A, 5B, 5C, 5D and magnetic resistance element 6A, 6B, 6C, 6D is slightly longer than the width of magnetic strip 2X, 2Y so that accurate detection is not prevented despite any skew of paper note P.

Figure 9:
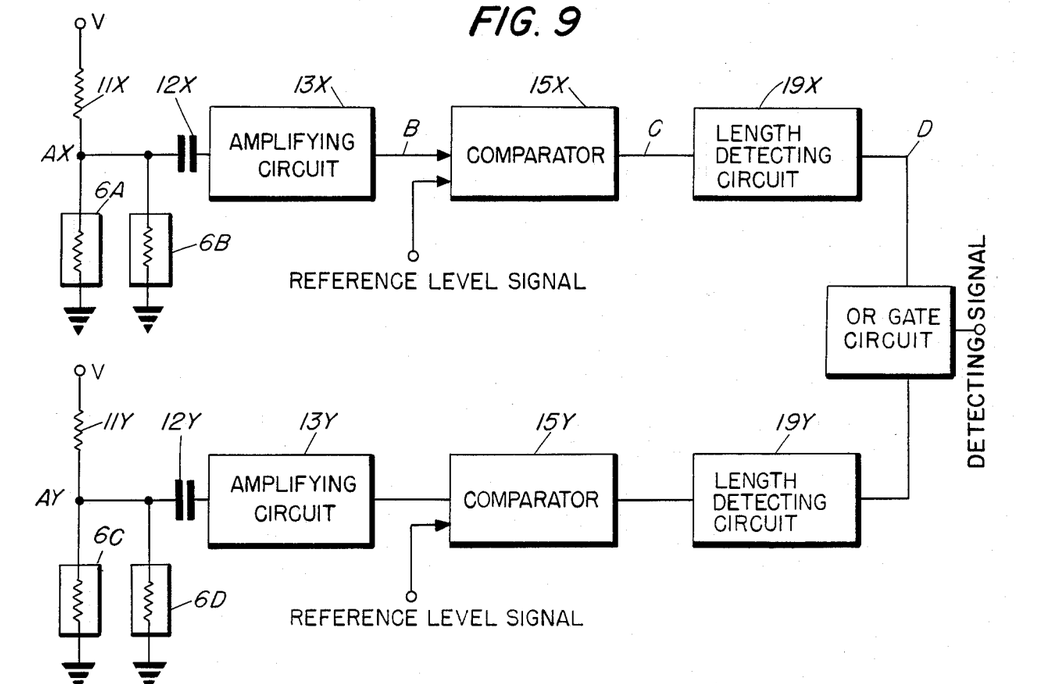
FIG. 9 is a block diagram of the electrical circuitry of the detecting device shown in FIGS. 8a and b.

FIG. 9 shows an electrical circuit for the detecting device shown in FIG. 8. Magnetic resistance elements 6A and 6B are connected in parallel and resistance elements 6C and 6D are connected in parallel. One end of the parallel combination of elements 6A, 6B is connected at point Ax to power supply V via a resistance 11y, while the other end is grounded. Likewise, one end of the parallel combination of elements 6C, 6D is connected at point Ay to a power supply V via a resistance 11y. At the connection points 11x or 11y, a voltage signal is obtained which varies according to the variation in resistance of respective magnetic resistance elements 6A, 6B or 6C, 6D. The circuitry for processing the signal at point AX and the circuit for processing the signal at point AY are identical. Connection point AX (AY) is connected through a capacitor 12X (12Y) to the input terminal of an amplifying circuit 13X (13Y) and the output signal of amplifying circuit 13X (13Y) is supplied to a comparator 15X (15Y). Comparator 15X (15Y) is used for converting the output signal into a binary signal by comparing the output signal from amplifier 13X (13Y) with a fixed reference level signal. The time width of the binary signal is detected by a length detecting circuit 19X (19Y) which produces output signal D corresponding to the length of magnetic strip 2X (2Y). This output signal after passing through OR gate circuit 20 is transmitted to a discriminating device (not shown) for determining whether the note is genuine or counterfeit.

Figure 10A:
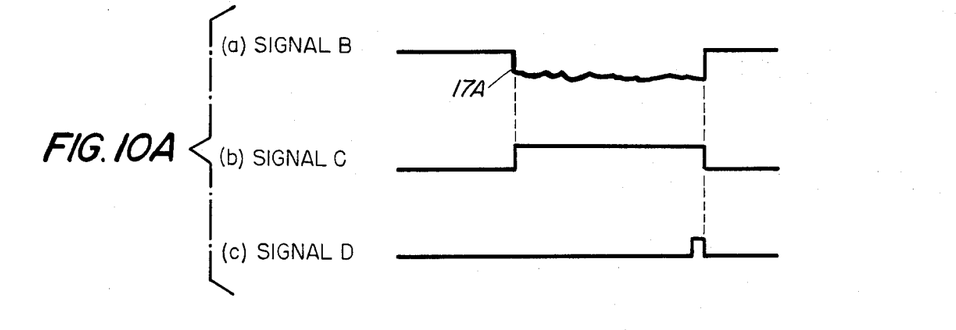
FIGS. 10(a) and (b) are signal waveform diagrams of each element shown in FIG. 9.
Figure 10B:
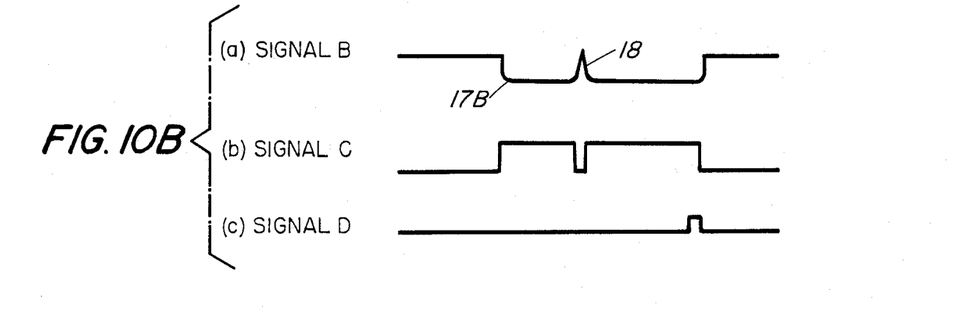

Explanation will be given regarding the detecting device shown in the embodiment of FIGS. 8 and 9. Magnetic resistance elements 6A and 6B have a resistance value based upon the magnetic field 7X produced by permanent magnets 5A and 5B (while 7Y is the magnetic field produced by permanent magnets 5C and 5D) when the paper note P is not between detecting heads 4A, 4B. When paper note P, with magnetic strip 2X, passes between detecting heads 4A, 4B, magnetic field 7X will be attenuated causing the resistance of magnetic resistance element 6A and 6B to decrease. Therefore, a temporary voltage variation will be produced at connection point AX as strip 2X passes between the heads. This signal is then amplified by amplifying circuit 13X, resulting in a signal B, as shown in FIGS. 10(A) and (B). FIG. 10(A) represents the signals obtained for the circuit of FIG. 9 when strip 2X is not broken, while FIG. 10(B) represents the signals produced if strip 2X is broken. The numerals 17A and 17B for signal B show the portion of the signal as magnetic strip 2X passes between the heads. The numeral 18 on signal B, shown in FIG. 10(B), is the waveform obtained if magnet strip 2X is broken. Signal B is then supplied to comparator 15A and is converted into a binary signal C as shown in FIGS. 10(A) and (B). Signal C is then supplied to circuit 19X which comprises a series of counters. Circuit 19X determines the width of signal C and if this width is more than a predetermined width, an output signal D. Signal D is then forwarded to a money discriminating device through OR gate circuit 20. If, however, paper note P is transported upside down, magnetic strip 2Y of paper money P is detected by resistance elements 6C, 6D and its signal is transmitted to length detecting circuit 19Y through amplifying circuit 13Y and comparator 15Y.

Figure 11A:
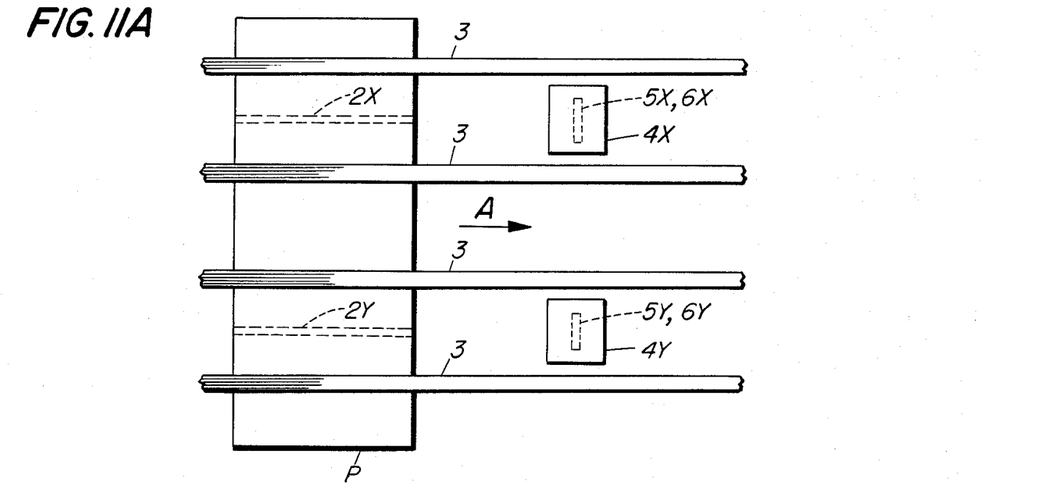
FIG. 11a is a plan view of still another embodiment of a detecting device according to the present invention.
Figure 11B:
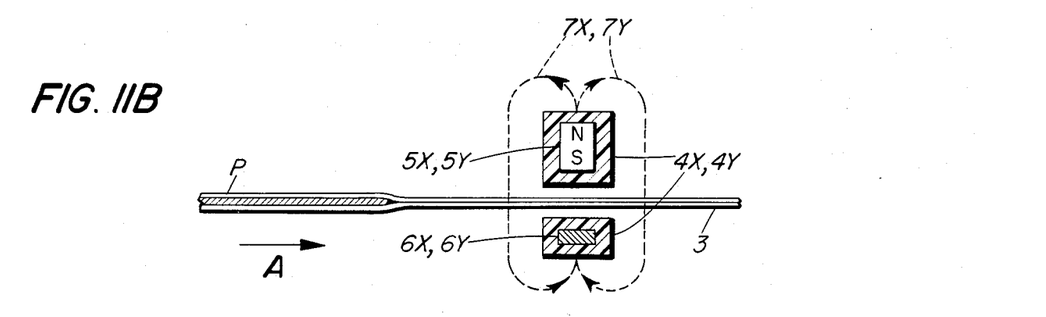

In FIGS. 11(a) and (b), paper note P is oriented on belts 3 with its longitudinal axis perpendicular to direction of travel A. In this embodiment, a detecting head 4X comprises a permanent magnet 5X located above belt 3 and a resistance element 6X located below belt 3. Detecting head 4X detects magnetic strip 2X when the note is right side up on the belt. Detecting head 4Y detects magnetic strip 2Y when note P is transported upside down; detecting head 4Y also comprises a permanent magnet 5Y and a magnetic resistance element 6Y. Paper note P is transported between, and without contact with, permanent magnets 5X and 5Y and magnetic resistance element 6X and 6Y. The circuit shown in FIG. 9 can be used for this embodiment wherein element 6X is used in lieu of 6A, 6B, and element 6Y is used in lieu of 6C, 6D.

Figure 12:
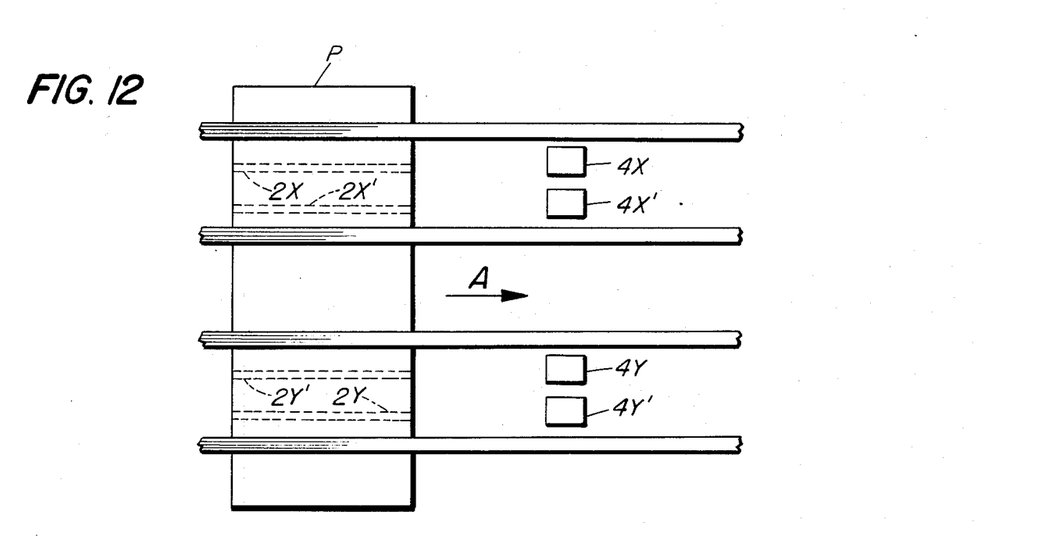
FIG. 12 is a plan view of still a further embodiment of a detecting device according to the present invention.

In all the embodiments mentioned above, paper note P is adapted for only one type of currency note. However, the system can be designed to accomodate a plurality of notes. When a plurality of currency is used, the location of the magnetic strips should be varied. Thus, the detecting heads 4X, 4X', 4Y, 4Y' may be arranged corresponding to the respective transportation paths of the magnetic strips, as shown in FIG. 12. In this case, numerals 2X' and 2Y' show the position of the magnetic strips for another kind of currency note.

Since obvious changes may be made in the illustrated embodiment of the device without departing from the scope of the invention, it is intended that all matter contained herein be interpreted as illustrative only. For example, a coil can be utilized as a means for generating a magnetic field in lieu of a permanent magnet.

I claim:

1. A detecting device for detecting a sheet of genuine paper money having a longer dimension and a shorter dimension, the sheet including an embedded magnetic strip having a length substantially equal to the shorter dimension of the sheet and a predetermined width, the strip being oriented within the sheet so that its length is substantially parallel to the shorter dimension of the sheet, said detecting device comprising:

transporting means for rapidly transporting the sheet in the direction of its longer dimension along a transportation path;

first and second magnetic sensors having long and narrow shaped planes positioned on directly opposite sides of said path along a line substantially perpendicular to said transportation path, each sensor including:

magnetic field generating means for generating a magnetic field which intersects said transportation path and passes through the generating means of said other magnetic sensor, the intersection of the magnetic field and the transportation path being long and narrow and having a longitudinal axis oriented substantially coincident with said magnetic strip at the moment when said magnetic strip passes between said first and second sensors; and variable magnetic resistance means adjacent said generating means having a resistance which is dependent on the magnetic field received from said generating means; and means for detecting the resistance variation of said variable magnetic resistance means when said magnetic strip passes between said first and second sensors.

2. A detecting device as claimed in claim 1 wherein each of said magnetic sensors further includes a non-magnetic housing to contain said magnetic field generating means and said variable magnetic resistance means.

3. A detecting device as claimed in claim 1 wherein said variable magnetic resistance means is positioned between said path and said magnetic field generating means.

* * * * *